(12) United States Patent
Takaki et al.

(10) Patent No.: US 11,158,525 B2
(45) Date of Patent: Oct. 26, 2021

(54) SUBSTRATE PROCESSING APPARATUS AND SUBSTRATE PROCESSING METHOD

(71) Applicant: TOKYO ELECTRON LIMITED, Tokyo (JP)

(72) Inventors: Yasuhiro Takaki, Kumamoto (JP); Shinichi Umeno, Kumamoto (JP); Takashi Nagai, Kumamoto (JP); Hisashi Morita, Kumamoto (JP); Nobuhiro Ogata, Kumamoto (JP); Yusuke Takamatsu, Kumamoto (JP); Jiro Higashijima, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 391 days.

(21) Appl. No.: 16/074,445

(22) PCT Filed: Jan. 20, 2017

(86) PCT No.: PCT/JP2017/001857
§ 371 (c)(1),
(2) Date: Aug. 1, 2018

(87) PCT Pub. No.: WO2017/135064
PCT Pub. Date: Aug. 10, 2017

(65) Prior Publication Data
US 2019/0067048 A1  Feb. 28, 2019

(30) Foreign Application Priority Data

Feb. 3, 2016 (JP) .............................. JP2016-019317

(51) Int. Cl.
*H01L 21/67* (2006.01)

(52) U.S. Cl.
CPC .. *H01L 21/67075* (2013.01); *H01L 21/67017* (2013.01); *H01L 21/67051* (2013.01); *H01L 21/67173* (2013.01)

(58) Field of Classification Search
None
See application file for complete search history.

(56) References Cited

U.S. PATENT DOCUMENTS 6,444,589 B1 * 9/2002 Yoneya ............. H01L 21/02019
216/92
8,303,723 B2 * 11/2012 Minami .............. H01L 21/6708
134/26

(Continued)

FOREIGN PATENT DOCUMENTS

JP  2013-207207  10/2013

OTHER PUBLICATIONS

International Search Report and Written Opinion for International Application No. PCT/JP2017/001857 dated Apr. 4, 2017, 9 pgs.

*Primary Examiner* — Karla A Moore
*Assistant Examiner* — Margaret D Klunk
(74) *Attorney, Agent, or Firm* — Amin, Turocy & Watson, LLP

(57) ABSTRACT

A recovery route returns, to a retaining tank, mixed solution supplied to a substrate processing unit. A discarding route discards the supplied mixed solution to a place other than the retaining tank. A switching controller causes the supplied mixed solution to flow into the discarding route during a time interval until a first time interval has elapsed from a time point when the substrate processing unit starts to supply the mixed solution; causes the supplied mixed solution to flow into the recovery route during a time interval until a second time interval, which is decided based on a predetermined recovery rate, has elapsed after the first time interval elapses; and causes the supplied mixed solution to flow into (Continued)

the discarding route during a time interval until supply of the mixed solution has been ended from a time point when the second time interval elapses.

12 Claims, 13 Drawing Sheets

(56) References Cited

U.S. PATENT DOCUMENTS

2013/0260569 A1* 10/2013 Ganster ............. H01L 21/67017
438/745
2017/0256426 A1* 9/2017 Iwao ................... B05B 13/0242

* cited by examiner

SUBSTRATE PROCESSING APPARATUS AND SUBSTRATE PROCESSING METHOD

FIELD

The present invention relates to a substrate processing apparatus and a substrate processing method.

BACKGROUND

Conventionally, there has been known a substrate processing apparatus that processes a substrate such as a semiconductor wafer and a glass substrate by using mixed solution obtained by mixing a first processing liquid and a second processing liquid.

In such a kind of substrate processing apparatus, there presents a case where the first processing liquid is recovered and reused by returning already-used mixed solution to a tank for retaining the first processing liquid, so as to reduce consumption of the first processing liquid, in some cases.

The recovered mixed solution includes the second processing liquid, and thus repetition of the above-mentioned recovery and reuse causes gradual reduction in the concentration of the first processing liquid in the tank. Therefore, recently, there is proposed a method for reducing the reduction in the concentration of the first processing liquid by recovering a part of the already-used mixed solution to discard the rest thereof and replenishing the tank with the first processing liquid having the same amount as that of the discarded mixed solution (see Patent Literature 1).

CITATION LIST

Patent Literature

Patent Literature 1: Japanese Laid-open Patent Publication No. 2013-207207

SUMMARY

Technical Problem

However, when already-used mixed solution is not recovered with high accuracy, there exists possibility that the concentration of the first processing liquid in the tank becomes an undesired one.

An object of one aspect of the embodiments, in view of the above-described situations, is to provide a substrate processing apparatus and a substrate processing method, which is able to recover the mixed solution with high accuracy so that the concentration of the first processing liquid for processing a substrate becomes a desired one.

Solution to Problem

A substrate processing apparatus according to one aspect of embodiment includes a retaining tank, a substrate processing unit, a recovery route, a discarding route, a supply route, a switching unit, and a switching controller. The recovery route returns, to the retaining tank, mixed solution supplied to the substrate processing unit. The discarding route discards the supplied mixed solution to a place other than the retaining tank. The switching unit switches a flowing destination of the supplied mixed solution between the recovery route and the discarding route. The switching controller controls the switching unit so as to cause the supplied mixed solution to flow into the discarding route during a time interval until a first time interval has elapsed from a time point when the substrate processing unit starts to supply the mixed solution; cause the supplied mixed solution to flow into the recovery route during a time interval until a second time interval, which is decided based on a predetermined recovery rate, has elapsed after the first time interval elapses; and cause the supplied mixed solution to flow into the discarding route during a time interval until supply of the mixed solution has been ended from a time point when the second time interval elapses.

Advantageous Effects of Invention

According to one aspect of the embodiments, it is possible to recover the mixed solution with high accuracy so that the concentration of the first processing liquid for processing a substrate becomes a desired one.

DESCRIPTION OF EMBODIMENTS

Hereinafter, exemplary embodiments of a substrate processing apparatus and a substrate processing method disclosed in the present application will be described in detail with reference to the accompanying drawings. In addition, the illustrative embodiments disclosed below are not intended to limit the present invention.

First Embodiment

A first embodiment of a substrate processing apparatus and a substrate processing method disclosed in the present application will be explained with reference to FIGS. 1 to 11.

1. Substrate Processing Method

Figure 1:
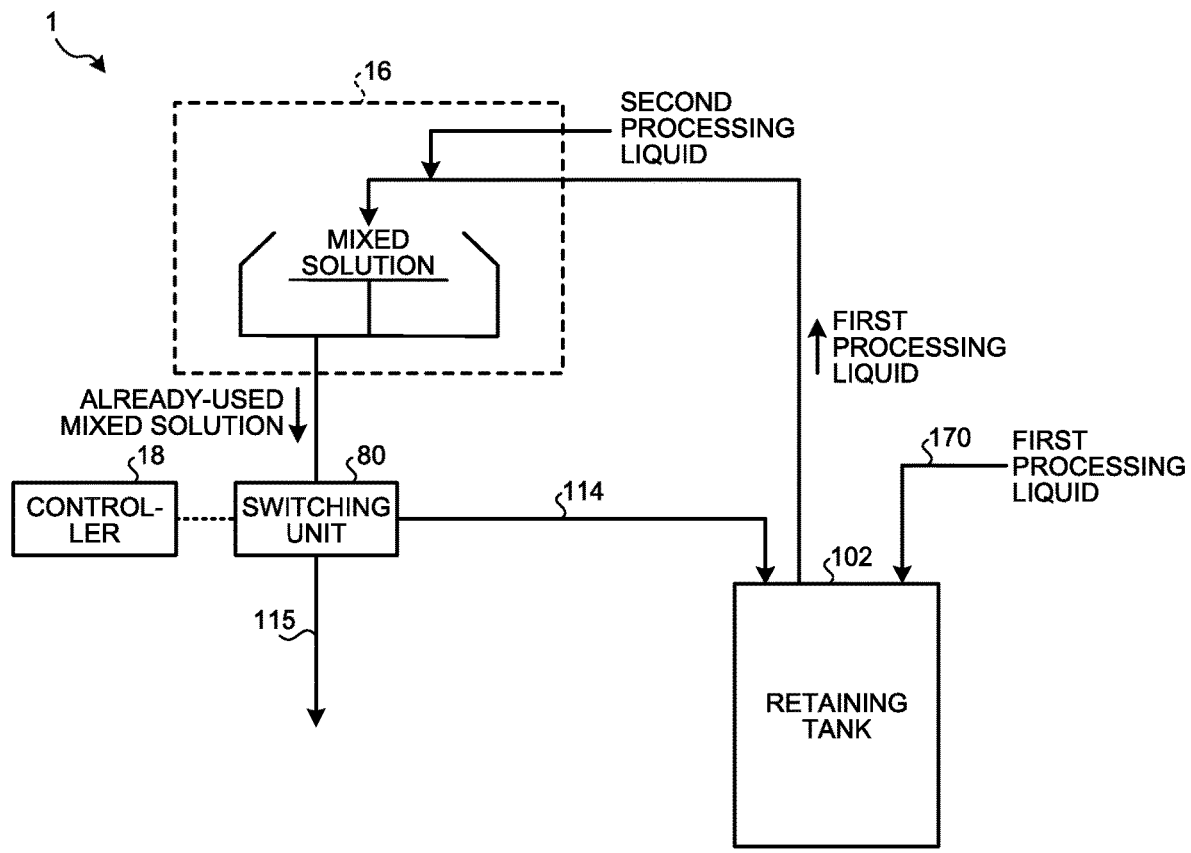
FIG. 1 is a diagram illustrating a schematic configuration of a processing liquid supply system in a substrate processing system according to a first embodiment.
Figure 2:
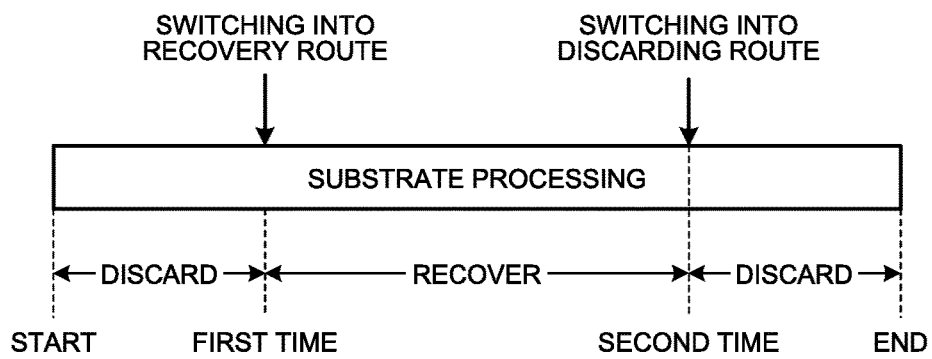
FIG. 2 is a diagram illustrating one example of a substrate processing method according to the first embodiment.

FIG. 1 is a diagram illustrating a schematic configuration of a processing liquid supply system in the substrate processing system according to the first embodiment. FIG. 2 is a diagram illustrating one example of the substrate processing method according to the first embodiment.

As illustrated in FIG. 1, a substrate processing system 1 according to the first embodiment processes a substrate by using mixed solution of a first processing liquid and a second processing liquid. The substrate processing system 1 recovers and reuses the already-used mixed solution. Specifically, the substrate processing system 1 includes a retaining tank 102, a processing unit 16, a recovery route 114, a discarding route 115, a supply route 170, a switching unit 80, and a controller 18.

The retaining tank 102 retains the first processing liquid. The processing unit 16 processes a substrate by using mixed solution of the first processing liquid supplied from the retaining tank 102 and the second processing liquid supplied from a place other than the retaining tank 102.

The recovery route 114 returns, to the retaining tank 102, mixed solution (already-used mixed solution) having used by the processing unit 16. The discarding route 115 ejects the already-used mixed solution to a place other than the retaining tank 102. The supply route 170 replenishes the retaining tank 102 with the first processing liquid.

The switching unit 80 switches a flowing destination of the already-used mixed solution from the recovery route 114 into the discarding route 115, or from the discarding route 115 to the recovery route 114. The switching unit 80 is controlled by the controller 18.

The above-configured substrate processing system 1 returns, via the recovery route 114, the already-used mixed solution to the retaining tank 102 to recover the first processing liquid, and reuses the recovered first processing liquid to reduce consumption of the first processing liquid.

The recovered mixed solution includes the second processing liquid, and thus repetition of the above-mentioned recovery and reuse causes gradual reduction in the concentration of the first processing liquid in the retaining tank 102. Therefore, the substrate processing system 1 recovers a part of the already-used mixed solution and discards the rest thereof, and replenishes, via the supply route 170, the retaining tank 102 with the first processing liquid having concentration relatively higher than that of the first processing liquid retained in the retaining tank 102, so as to suppress reduction in the concentration of the first processing liquid in the retaining tank 102.

It is preferable that an actual recovery rate of the already-used mixed solution is matched, as much as possible, with a predetermined recovery rate in order to stabilize the concentration of the first processing liquid in the retaining tank 102 at a desired one. The concentration (namely, mixing ratio between first and second processing liquids) or the flow volume of the mixed solution is not stable just after a start or just before an end of a process using the mixed solution executed by the processing unit 16 due to, for example, a time lag caused by an opening/closing operation of a valve or the like, and thus there exists possibility that the concentration or the flow volume is not a desired one.

Therefore, if the already-used mixed solution is to be recovered during such a time interval, there exists possibility that the concentration of the first processing liquid in the retaining tank 102 falls below the lowest concentration needed for processing a substrate. In this case, the first processing liquid is to be additionally supplied from the supply route 170, for example, in order to recover the concentration of the first processing liquid in the retaining tank 102. For example, there further exists possibility that a liquid amount in the retaining tank 102 is excessively increased or is excessively reduced. In this case, discarding the exceeded amount or replenishment of the shortage amount leads to excess consumption in the first processing liquid.

Therefore, the substrate processing system 1 according to the first embodiment is configured to recover the already-used mixed solution during a time interval except for a predetermined time interval after the start and that before the end, in which the concentration and the flow volume are not stable.

Specifically, as illustrated in FIG. 2, the already-used mixed solution is fed into the discarding route 115 until a first time interval has elapsed from a start of the process of the processing unit 16, the already-used mixed solution is fed into the recovery route 114 until a second time interval has elapsed from a time point when the first time interval has elapsed, and the already-used mixed solution is fed into the discarding route 115 until the process executed by the processing unit 16 has ended from a time point when the second time interval has elapsed.

Thus, the already-used mixed solution is able to be recovered with high accuracy at stable concentration and stable flow volume so that it is possible to match an actual recovery rate of the already-used mixed solution with a predetermined recovery rate as quickly as possible. Therefore, by employing the substrate processing system 1 according to the first embodiment, it is possible to make a concentration of the first processing liquid in the retaining tank 102 a desired one.

2. Substrate Processing System

Figure 3:
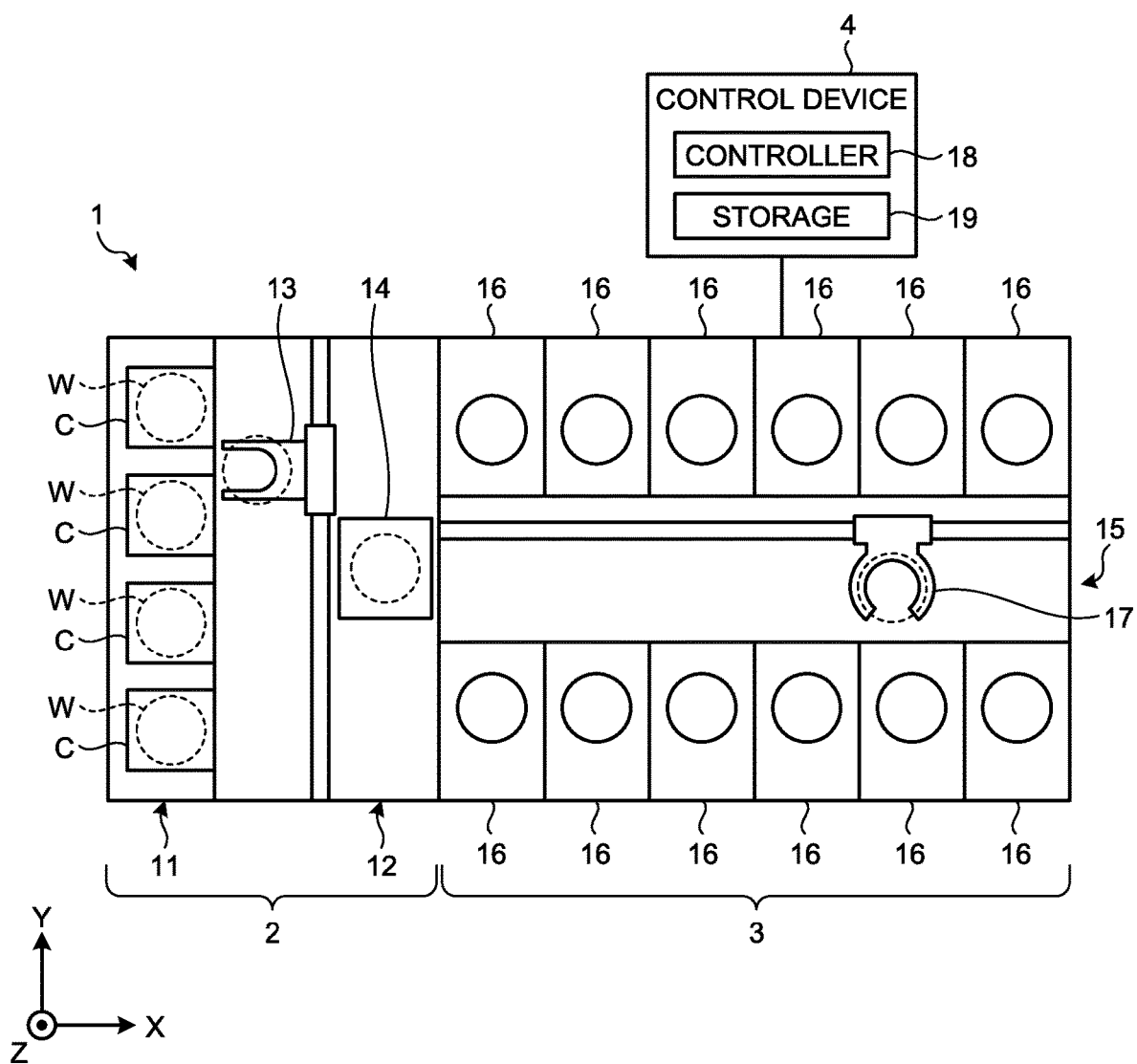
FIG. 3 is a diagram illustrating a schematic configuration of the substrate processing system according to the first embodiment.

Next, a schematic configuration of the substrate processing system 1 according to the first embodiment will be explained with reference to FIG. 3. FIG. 3 is a diagram illustrating a schematic configuration of the substrate processing system 1 according to the first embodiment. Hereinafter, in order to make a positional relationship clear, X-axis, Y-axis, and Z-axis will be defined to be perpendicular to each other and the positive Z-axis direction is regarded as a vertically upward direction.

As illustrated in FIG. 3, the substrate processing system 1 includes a carry-in/out station 2 and a processing station 3.

The carry-in/out station 2 and the processing station 3 are provided adjacent to each other.

The carry-in/out station 2 includes a carrier placing section 11 and a transfer section 12. In the carrier placing section 11, a plurality of carriers C are placed to horizontally accommodate a plurality of substrates, namely, semiconductor wafers (hereinafter, wafer W) in the present embodiment.

The transfer section 12 is provided adjacent to the carrier placing section 11, and includes therein a substrate transfer device 13 and a delivery unit 14. The substrate transfer device 13 includes a wafer holding mechanism configured to hold the wafer W. The substrate transfer device 13 is movable horizontally and vertically and is pivotable around a vertical axis, and transfers the wafer W between the corresponding carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are provided side by side at both sides of the transfer section 15.

The transfer section 15 includes therein a substrate transfer device 17. The substrate transfer device 17 includes a wafer holding mechanism configured to hold the wafer W. The substrate transfer device 17 is movable horizontally and vertically and is pivotable around the vertical axis, and transfers the wafer W between the delivery unit 14 and the corresponding processing unit 16 by using the wafer holding mechanism.

Each of the processing units 16 performs a predetermined substrate processing on the wafer W transferred by the substrate transfer device 17.

The substrate processing system 1 further includes a control device 4. The control device 4 is a computer, for example. The control device 4 includes a controller 18 and a storage 19. The storage 19 stores therein a program for controlling various types of processes that are performed in the substrate processing system 1. The controller 18 reads out and executes the program stored in the storage 19 to control operations of the substrate processing system 1.

The program may be recorded in a computer-readable recording medium and thus may be installed into the storage 19 of the control device 4 from the recording medium. A computer-readable recording medium includes, for example, a hard disk (HD), a flexible disk (FD), a compact disc (CD), a magneto-optical disk (MO), and a memory card.

In the substrate processing system 1 configured as described above, the substrate transfer device 13 of the carry-in/out station 2 first takes out the wafer W from one of the carriers C placed in the carrier placing section 11, and places the taken wafer W on the delivery unit 14. The wafer W placed on the delivery unit 14 is taken out from the delivery unit 14 by the substrate transfer device 17 of the processing station 3, and is carried into one of the processing units 16.

The wafer W carried into the processing unit 16 is processed by the processing unit 16, and then is carried out from the processing unit 16 and placed on the delivery unit 14 by using the substrate transfer device 17. Then, the processed wafer W placed on the delivery unit 14 is returned to the corresponding carrier C in the carrier placing section 11 by using the substrate transfer device 13.

The controller 18 of the control device 4 includes: a microcomputer including a Central Processing Unit (CPU), a Read Only Memory (ROM), a Random Access Memory (RAM), an input/output port, etc.; and various circuits. The CPU of the microcomputer reads out and executes a program stored in the ROM so as to realize control to be mentioned later. The storage 19 is realized by using a semiconductor memory element such as a RAM and a flash memory, or a storage such as a hard disk and an optical disk.

3. Processing Unit

Figure 4:
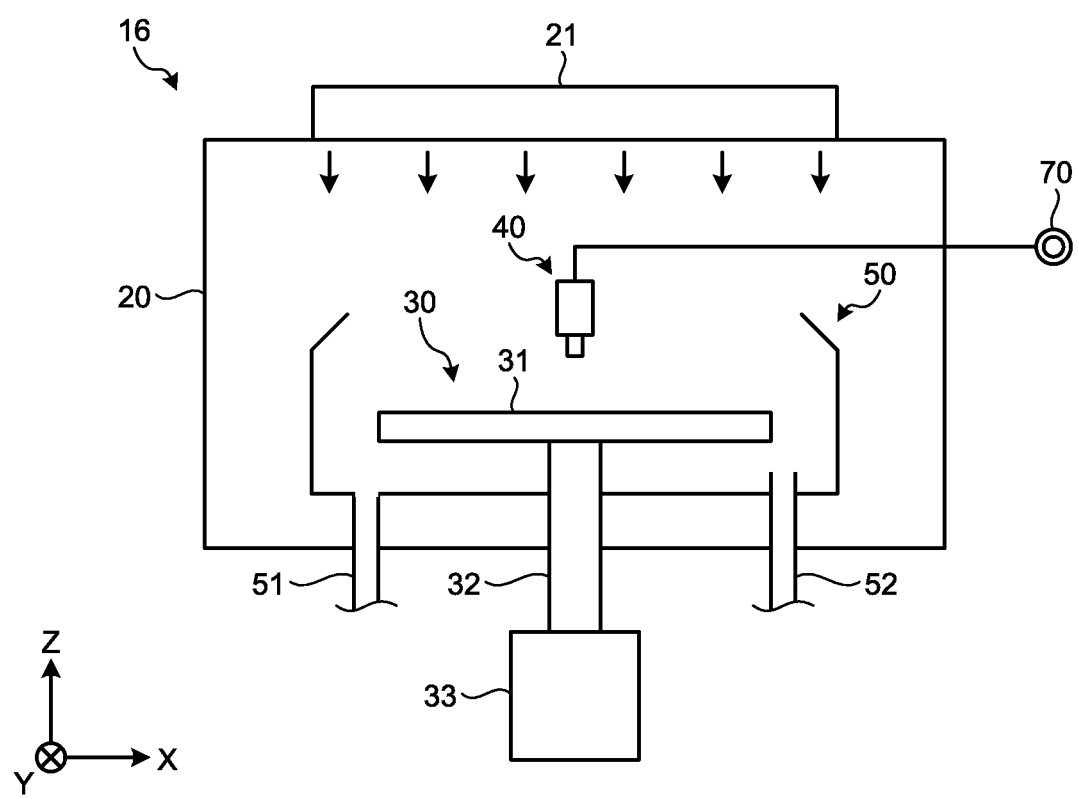
FIG. 4 is a diagram illustrating a schematic configuration of a processing unit.

Next, a schematic configuration of the processing unit 16 will be described with reference to FIG. 4. FIG. 4 is a diagram illustrating the schematic configuration of the processing unit 16. As illustrated in FIG. 4, the processing unit 16 includes a chamber 20, a substrate holding mechanism 30 (holder), a processing fluid supply unit 40 (line), and a recovery cup 50.

The chamber 20 accommodates the substrate holding mechanism 30 (holder), the processing fluid supply unit 40 (line), and the recovery cup 50. A fan filter unit (FFU) 21 is provided on a ceiling of the chamber 20. The FFU 21 forms a downflow within the chamber 20.

The substrate holding mechanism 30 (holder) includes a holding unit 31, a supporting unit 32, and a driving unit 33. The holding unit 31 horizontally holds the wafer W. The supporting unit 32 is a vertically extending member, and includes a bottom end rotatably supported by the driving unit 33 and a leading end horizontally supporting the holding unit 31. The driving unit 33 rotates the supporting unit 32 around the vertical axis. The substrate holding mechanism 30 (holder) rotates the supporting unit 32 by using the driving unit 33 to rotate the holding unit 31 supported by the supporting unit 32, and consequently rotates the wafer W held on the holding unit 31.

The processing fluid supply unit 40 supplies processing fluid onto the wafer W. The processing fluid supply unit 40 is connected to a processing fluid supply source 70.

The recovery cup 50 is arranged to surround the holding unit 31, and collects processing liquid scattered from the wafer W due to the rotation of the holding unit 31. A drain port 51 is formed on a bottom of the recovery cup 50. The processing liquid collected by the recovery cup 50 is discharged from the drain port 51 to the outside of the processing unit 16. In addition, an exhaust port 52 is formed on the bottom of the recovery cup 50 to discharge gas supplied from the FFU 21 to the outside of the processing unit 16.

Specific Configuration Example of Processing Liquid Supply System

Figure 5:
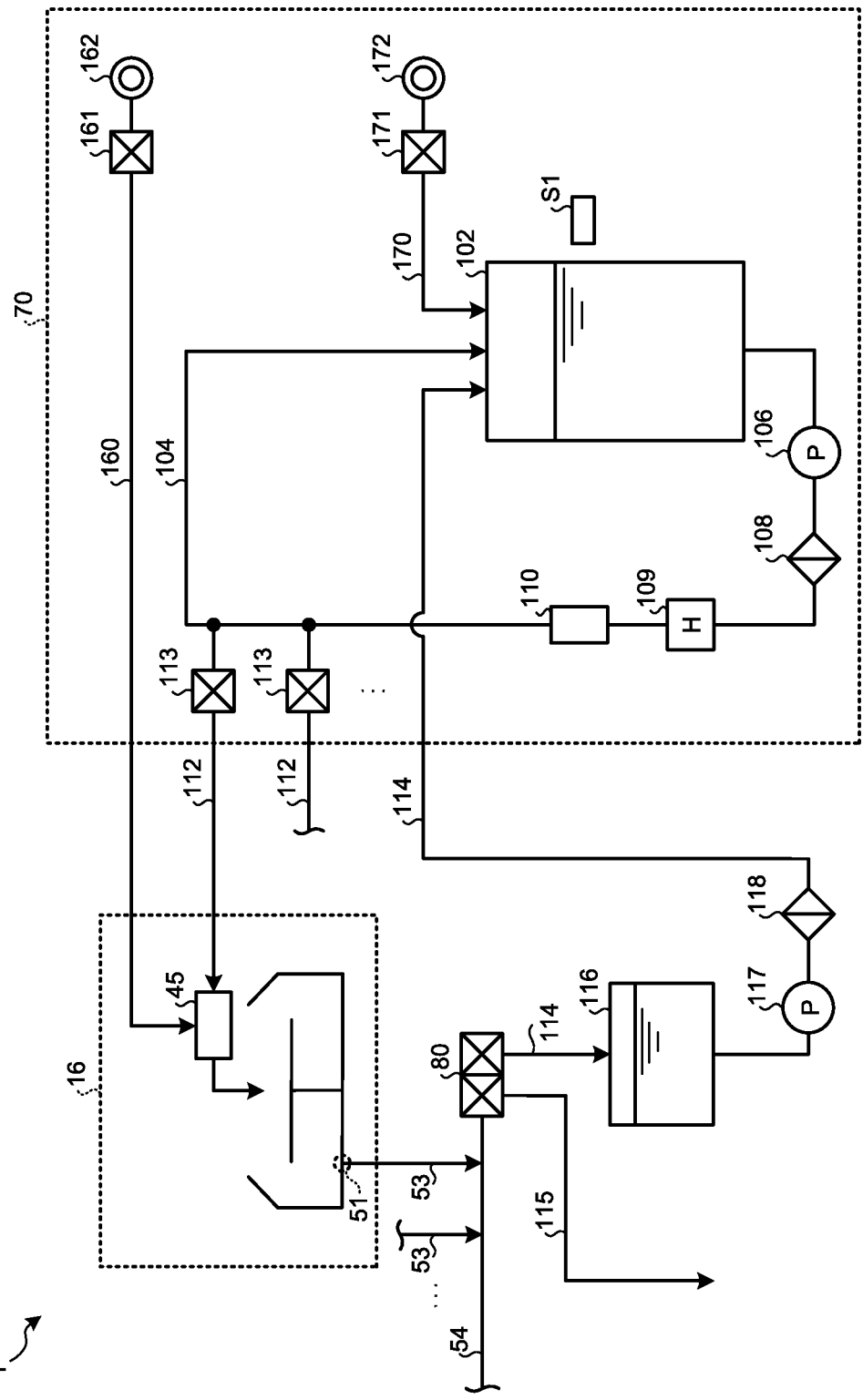
FIG. 5 is a diagram illustrating a specific configuration example of the processing liquid supply system in the substrate processing system according to the first embodiment.

Next, a specific configuration example of the processing liquid supply system in the substrate processing system 1 according to the first embodiment will be explained with reference to FIG. 5. FIG. 5 is a diagram illustrating the specific configuration example of the processing liquid supply system in the substrate processing system 1 according to the first embodiment.

Hereinafter, a configuration example of the processing liquid supply system in a case where Sulfuric acid Hydrogen Peroxide Mixture (SPM) is supplied to the wafer W will be explained. Sulfuric acid is used as the first processing liquid and hydrogen peroxide is used as the second processing liquid, and the SPM is mixed solution of the first and second processing liquids.

4-1. Processing Fluid Supply Source

As illustrated in FIG. 5, the processing fluid supply source 70 includes, as a supply system of sulfuric acid, the retaining tank 102 that retains sulfuric acid, a circulation route 104 that starts from the retaining tank 102 to return to the retaining tank 102, and a plurality of branch routes 112 each of which branches from the circulation route 104 to be connected to the corresponding processing unit 16.

The retaining tank 102 is provided with a liquid level sensor S1. The liquid level sensor S1 is arranged on the side of the retaining tank 102, for example, and detects the liquid surface of sulfuric acid retained in the retaining tank 102. Specifically, the liquid level sensor S1 is a sensor for detecting a lower limit of the liquid level in the retaining tank 102. A result detected by the liquid level sensor S1 is output to the controller 18.

A pump 106, a filter 108, a heater 109, and a concentration meter 110 are arranged on the circulation route 104 in this order from the upstream side of the circulation route 104. The pump 106 forms a circulation flow that starts from the retaining tank 102 and returns to the retaining tank 102 via the circulation route 104. The filter 108 removes contaminants, such as particles, included in the sulfuric acid. The heater 109 is controlled by the controller 18 so as to heat the sulfuric acid, which circulates through the circulation route 104, up to a set temperature. The concentration meter 110 detects the concentration of the sulfuric acid, which circulates through the circulation route 104, and outputs a detection result to the controller 18.

The plurality of branch routes 112 are connected to the circulation route 104 on the downstream side from the concentration meter 110. Each of the branch routes 112 is connected to a mixing unit 45 to be mentioned later of the corresponding processing unit 16, and supplies sulfuric acid flowing through the circulation route 104 to the corresponding mixing unit 45. Each of the branch routes 112 is provided with a valve 113.

The processing fluid supply source 70 includes, as a supply system of hydrogen peroxide, a hydrogen peroxide supply route 160, a valve 161, and a hydrogen peroxide supply source 162. One end of the hydrogen peroxide supply route 160 is connected to the hydrogen peroxide supply source 162 via the valve 161, and the other end is connected to the mixing unit 45 to be mentioned later of the processing unit 16. The processing fluid supply source 70 supplies to the mixing unit 45 of the processing unit 16 hydrogen peroxide, which is supplied from the hydrogen peroxide supply source 162, via the hydrogen peroxide supply route 160.

The processing fluid supply source 70 further includes the supply route 170, a valve 171, and a sulfuric acid supply source 172. One end of the supply route 170 is connected to the sulfuric acid supply source 172 via the valve 171, and the other end is connected to the retaining tank 102. The sulfuric acid supply source 172 supplies sulfuric acid. The processing fluid supply source 70 supplies to the retaining tank 102 sulfuric acid, which is supplied from the sulfuric acid supply source 172, via the supply route 170.

Here, although illustration thereof is omitted, the processing fluid supply source 70 further includes a rinse liquid supply route for supplying rinse liquid to the processing unit 16. As the rinse liquid, deionized water (DIW) may be used, for example.

4-2. Processing Unit

The processing unit 16 includes the mixing unit 45. The mixing unit 45 mixes sulfuric acid supplied from the corresponding branch route 112 and hydrogen peroxide supplied from the hydrogen peroxide supply route 160, so as to generate SPM that is mixed solution thereof, and supplies the generated SPM to the processing fluid supply unit 40 (see FIG. 4). The mixing unit 45 may be integrally provided with the processing fluid supply unit 40.

The drain port 51 of each of the processing units 16 is connected with an ejection route 54 via a branch route 53. SPM used in each of the processing units 16 is ejected to the ejection route 54 from the corresponding drain port 51 via the branch route 53.

Here, supply of the SPM and supply of the rinse liquid are performed by using the processing fluid supply unit 40; however, the processing unit 16 may additionally include a processing fluid supply unit for supplying the rinse liquid.

4-3. Switching Unit, Recovery Route, and Discarding Route

The substrate processing system 1 further includes the switching unit 80, the recovery route 114, and the discarding route 115. The switching unit 80 is connected with the ejection route 54, the recovery route 114, and the discarding route 115, and switches a flowing destination of already-used SPM flowing through the ejection route 54 between the recovery route 114 and the discarding route 115 in accordance with control of the controller 18.

One end of the recovery route 114 is connected with the switching unit 80, and the other end is connected with the retaining tank 102. A recovery tank 116, a pump 117, and a filter 118 are arranged on the recovery route 114 in this order from the upstream side of the recovery route 114. The recovery tank 116 temporarily retains already-used SPM. The pump 117 forms a flow that delivers already-used SPM retained in the recovery tank 116 to the retaining tank 102. The filter 118 removes contaminants, such as particles, included in the already-used SPM.

The discarding route 115 is connected to the switching unit 80 and ejects already-used SPM, which flows from the ejection route 54 via the switching unit 80, to the outside of the substrate processing system 1.

5. Contents of Substrate Processing

Figure 6:
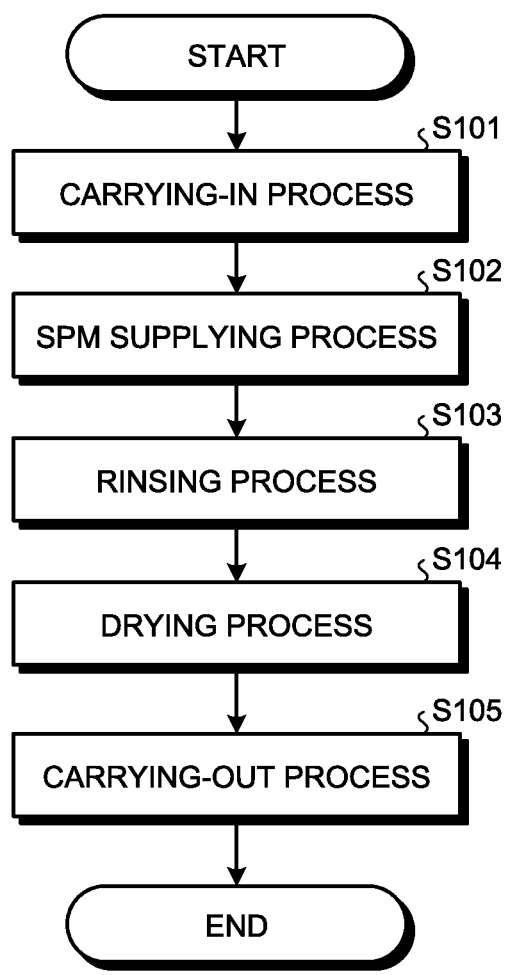
FIG. 6 is a flowchart illustrating one example of a procedure for substrate processing to be executed by the processing unit according to the first embodiment.

Next, contents of substrate processing to be executed by the processing unit 16 according to the present embodiment will be explained with reference to FIG. 6. FIG. 6 is a flowchart illustrating one example of a procedure for the substrate processing to be executed by the processing unit 16 according to the first embodiment. The processing procedure illustrated in FIG. 6 is executed in accordance with control of the controller 18.

In the processing unit 16, a carrying-in process of the wafer W is executed (Step S101). Specifically, the substrate transfer device 17 (see FIG. 3) carries the wafer W into the chamber 20 (see FIG. 4) of the processing unit 16, and is held by the holding part 31. Next, the processing unit 16 rotates the holding part 31 at a predetermined rotational speed (for example, 50 rpm).

Next, in the processing unit 16, an SPM supplying process is executed (Step S102). In the SPM supplying process, the valve 113 and the valve 161 are opened for a predetermined time interval (for example, 30 seconds) so as to supply SPM to an upper surface of the wafer W from the processing fluid supply unit 40. The SPM supplied to the wafer W is spread over the surface of the wafer W by a centrifugal force caused by the rotation of the wafer W.

This SPM supplying process is for removing resist that is formed on the upper surface of the wafer W by using a strong oxidizing power of Caro's acid included in the SPM and reaction heat of sulfuric acid and hydrogen peroxide, for example.

Flow volumes of sulfuric acid and hydrogen peroxide are decided in accordance with a mixing ratio of sulfuric acid and hydrogen peroxide. A ratio of sulfuric acid in SPM is higher than that of hydrogen peroxide, and thus a flow volume of sulfuric acid is set to be higher than that of hydrogen peroxide.

When the SPM supplying process of Step S102 has been completed, a rinsing process is executed in the processing unit 16 (Step S103). The rinsing process is for supplying rinse liquid (for example, DIW) to the upper surface of the wafer W from the processing fluid supply unit 40. The DIW supplied to the wafer W is spread over the surface of the wafer W by a centrifugal force caused by the rotation of the wafer W. Thus, SPM remaining on the wafer W is rinsed away by the DIW.

Next, in the processing unit 16, a drying process is executed (Step S104). In this drying process, the wafer W is rotated at a predetermined rotational speed (for example, 1000 rpm) for a predetermined time interval. Thus, DIW remaining on the wafer W is spun off and the wafer W is dried. Next, the rotation of the wafer W is stopped.

In the processing unit 16, a carrying-out process is executed (Step S105). In the carrying-out process, the wafer W that is held by the holding part 31 is transmitted to the substrate transfer device 17. When this carrying-out process has been completed, the substrate processing for the one wafer W is completed.

6. Deciding Method of Recovery Rate

Figure 7:
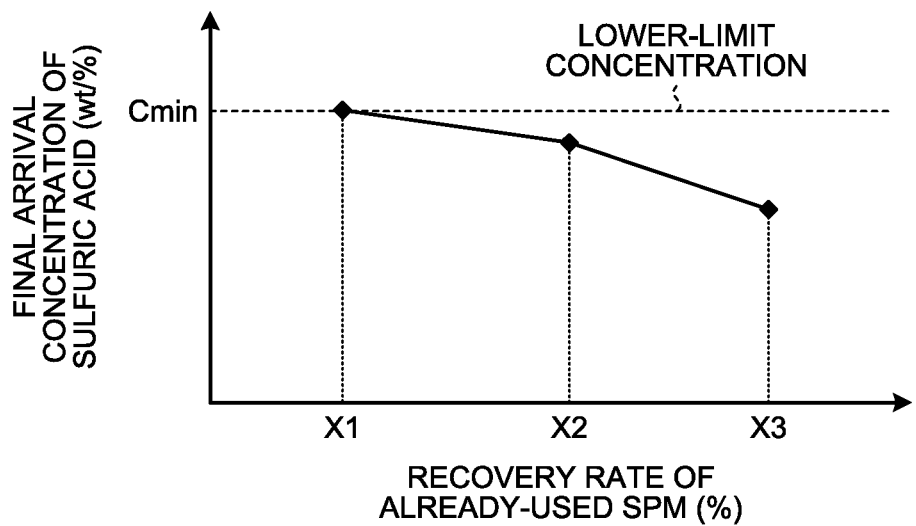
FIG. 7 is a graph depicting final arrival concentrations of sulfuric acid in a retaining tank when recovery rates of already-used SPM are X1 to X3%.
Figure 8:
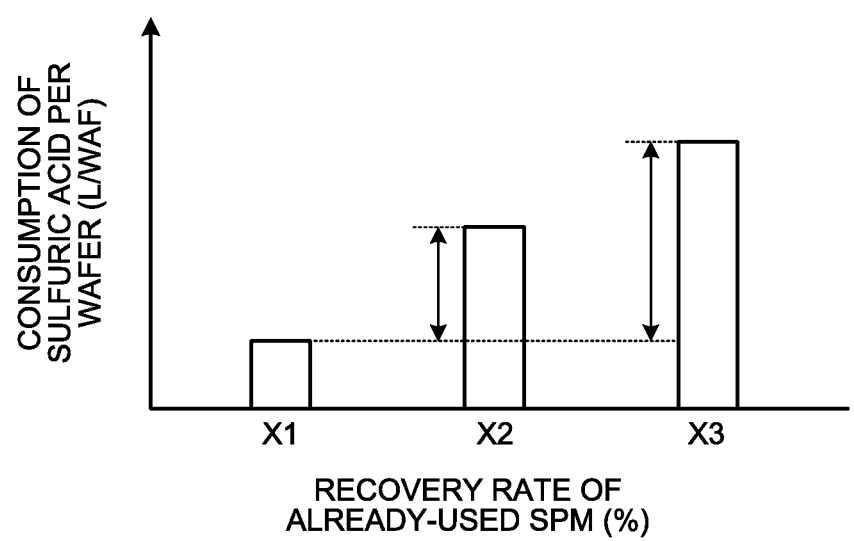
FIG. 8 is a graph depicting consumptions of sulfuric acid per wafer when the recovery rates of the already-used SPM are X1 to X3%.
Figure 9:
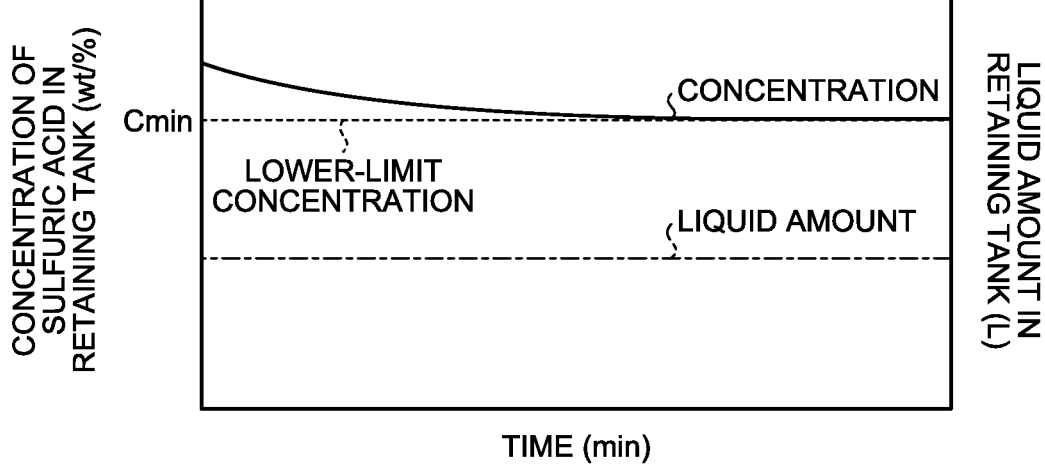
FIG. 9 is a graph depicting temporal changes in a concentration of sulfuric acid in the retaining tank and a liquid amount in the retaining tank when a plurality of wafers is continuously processed by the processing unit.

Next, a deciding method of a recovery rate of already-used SPM will be explained with reference to FIGS. 7 to 9. FIG. 7 is a graph depicting final arrival concentrations of sulfuric acid in the retaining tank 102 when recovery rates of already-used SPM are X1 to X3%. FIG. 8 is a graph depicting consumptions of sulfuric acid per the wafer W when the recovery rates of the already-used SPM are X1 to X3%. FIG. 9 is a graph depicting temporal changes in a concentration of sulfuric acid in the retaining tank 102 and a liquid amount in the retaining tank 102 when the plurality of wafers W is continuously processed by the processing unit 16.

In FIG. 7, final arrival concentrations of sulfuric acid in the retaining tank 102 are depicted in a case where sulfuric acid having a concentration similar to an initial concentration (concentration before diluted by hydrogen peroxide) of sulfuric acid in the retaining tank 102 and having an amount similar to a reduction amount (amount obtained by subtracting amount of liquid returning to the retaining tank 102 from amount of liquid supplied to the processing unit 16 from retaining tank 102) of liquid in the retaining tank 102 is fed from the supply route 170. The final arrival concentration is a convergence value of the concentration of the sulfuric acid in the retaining tank 102 in a case where the plurality of wafers W is continuously processed while recovering already-used SPM and feeding sulfuric acid.

The recovery rate of already-used SPM is decided on the basis of a lower-limit concentration Cmin that is set to be a lower limit of the concentration of sulfuric acid that is needed for the process using SPM.

The lower-limit concentration Cmin is a lower limit of the concentration of sulfuric acid so that the temperature of SPM does not fall below a temperature needed for exerting a desired resist removal performance, for example. The temperature of SPM is decided by a heating temperature of sulfuric-acid heated by the heater 109 and reaction heat that is generated by reaction of sulfuric acid and hydrogen peroxide. When the concentration of sulfuric acid decreases, the above-mentioned reaction heat decreases, and there exists possibility that the temperature of SPM falls below the temperature needed for exerting the desired resist removal performance.

Reduction in concentration of sulfuric acid is caused by flow of hydrogen peroxide, which is included in recovered already-used SPM, into the retaining tank 102, which is leading to dilution of sulfuric acid in the retaining tank 102. Therefore, when a recovery rate of already-used SPM is excessively increased, amount of hydrogen peroxide flowing into the retaining tank 102 increases, and the reduction in concentration of sulfuric acid increases, and thus a final arrival concentration of sulfuric acid accordingly falls below the lower-limit concentration Cmin, as illustrated in FIG. 7.

In this case, the liquid in the retaining tank 102 is needed to be replaced with fresh sulfuric acid in order to recover the concentration of sulfuric acid. As illustrated in FIG. 8, performance of such a liquid replacement leads to increase in consumption of sulfuric acid per the wafer W.

Therefore, it is desirable that a recovery rate of already-used SPM is decided to be a recovery rate X1% at which the concentration of sulfuric acid retained in the retaining tank 102 is kept at the lower-limit concentration Cmin, in order to reduce the consumption of sulfuric acid as quickly as possible.

As indicated by using a solid line in FIG. 9, recovery of already-used SPM under the recovery rate X1% is able to keep the concentration in the tank at the lower-limit concentration Cmin. Therefore, redundant consumption of sulfuric acid caused by the liquid replacement is prevented, and thus consumption of sulfuric acid is able to be reduced as quickly as possible.

As indicated by using a dashed line in FIG. 9, sulfuric acid having a concentration that is similar to an initial concentration of sulfuric acid in the retaining tank 102 and further having an amount that is similar to a reduction amount of liquid in the retaining tank 102 is fed from the supply route 170, and thus it is possible to keep the liquid amount in the retaining tank 102 constant. Therefore, an increased amount is not to be discarded and a shortage amount is not to be fed, and thus it is possible to reduce consumption of sulfuric acid as quickly as possible.

Assume that an initial concentration of sulfuric acid retained in the retaining tank 102 is 96 wt %, a mixing ratio between sulfuric acid and hydrogen peroxide is 6:1, and the lower-limit concentration Cmin of sulfuric acid is 86 wt %, a recovery rate X1 of already-used SPM is decided to be 53%.

7. Recovery Process

Figure 10:
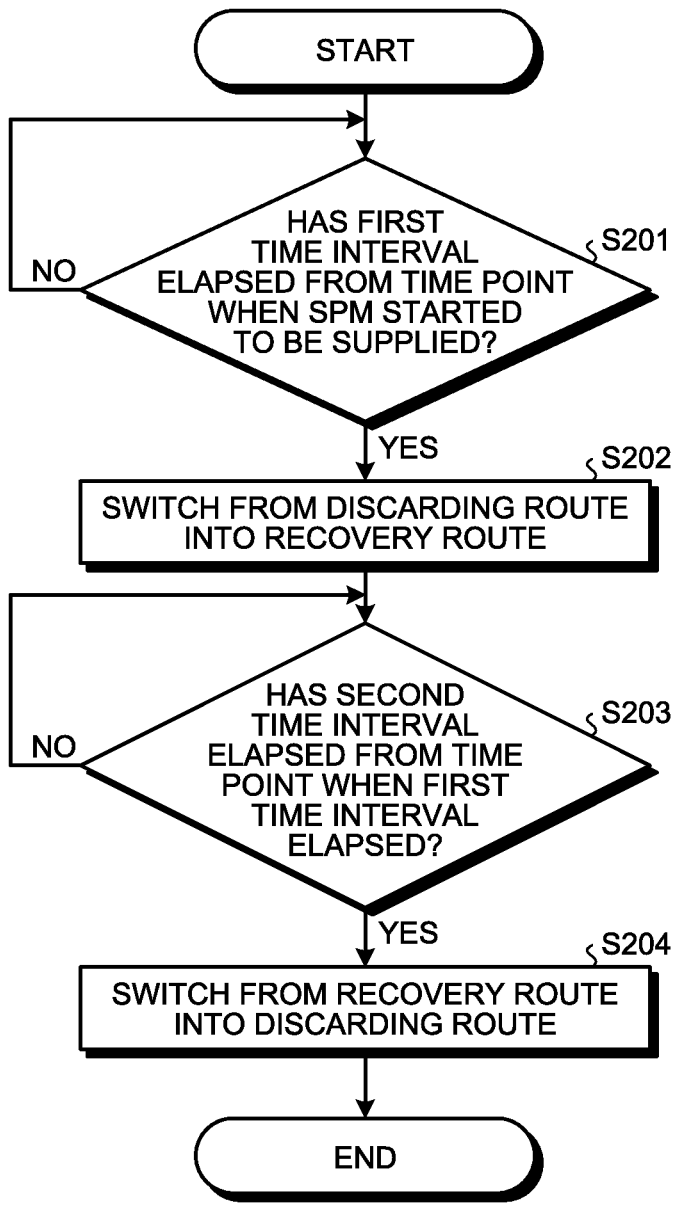
FIG. 10 is a flowchart illustrating one example of a procedure for a recovery process.

Next, contents of a recovery process of already-used SPM will be explained with reference to FIG. 10. FIG. 10 is a flowchart illustrating one example of a procedure for the recovery process. In FIG. 10, a procedure for the recovery process is depicted in a case where the ejection route 54 and the discarding route 115 are communicated with each other at a start of the SPM supplying process. The processing procedure depicted in FIG. 10 is controlled by the controller 18.

As illustrated in FIG. 10, the controller 18 determines whether or not the first time interval has elapsed from a time when the processing unit 16 started the SPM supplying process (see FIG. 6) (Step S201). The first time interval is set to be a time interval that is longer than a time interval from a time when the valves 113 and 161 are opened to a time when flow volumes of sulfuric acid and hydrogen peroxide become stable.

In the present embodiment, the start time point of the SPM supplying process is set to be the time point when both of the valves 113 and 161 becomes an opened state; however, definition of the start time point of the SPM supplying process is not limited thereto. For example, another definition may be employed, such as a time point when the controller 18 transmits open command signals to the valves 113 and 161 and a time point when SPM is reaches the wafer W.

The controller 18 repeats a determination process of Step S201 until the first time interval has elapsed (Step S201: No). In this case, the ejection route 54 is communicated with the discarding route 115, and thus already-used SPM is discarded to the outside from the discarding route 115.

Next, when determining that the first time interval has elapsed in Step S201 (Step S201: Yes), the controller 18 controls the switching unit 80 to switch a flowing destination of already-used SPM from the discarding route 115 into the recovery route 114 (Step S202). Thus, already-used SPM flows into the recovery route 114 from the ejection route 54 to be returned to the retaining tank 102.

Next, the controller 18 determines whether or not the second time interval has elapsed from the time when the first time interval elapsed (Step S203). The second time interval is set to be a time interval until a recovery rate of already-used SPM becomes the predetermined recovery rate X1 of already-used SPM. The controller 18 repeats the determination process of Step S202 until the second time interval has elapsed (Step S203: No).

Next, when determining that the second time interval has elapsed in Step S203 (Step S203: Yes), the controller 18 switches a flowing destination of already-used SPM from the recovery route 114 into the discarding route 115 (Step S204). Thus, already-used SPM is discarded to the outside from the discarding route 115.

As described above, the substrate processing system 1 according to the first embodiment is configured to recover, at a predetermined recovery rate, already-used SPM during a time interval except for a predetermined time interval after a start of the SPM supplying process and a predetermined time interval before an end of the SPM supplying process. Thus, already-used SPM is able to be recovered at stable concentration and stable flow volume, so that it is possible to match an actual recovery rate of already-used SPM with the predetermined recovery rate as quickly as possible. Therefore, by employing the substrate processing system 1 according to the first embodiment, it is possible to reduce the consumption of sulfuric acid as quickly as possible.

When the ejection route 54 and the recovery route 114 are communicated with each other at a start of the SPM supplying process, it is sufficient that the controller 18 executes a process for changing a flowing destination of already-used SPM from the recovery route 114 into the discarding route 115 before the start of the SPM supplying process.

8. Replenishing Process

Figure 11:
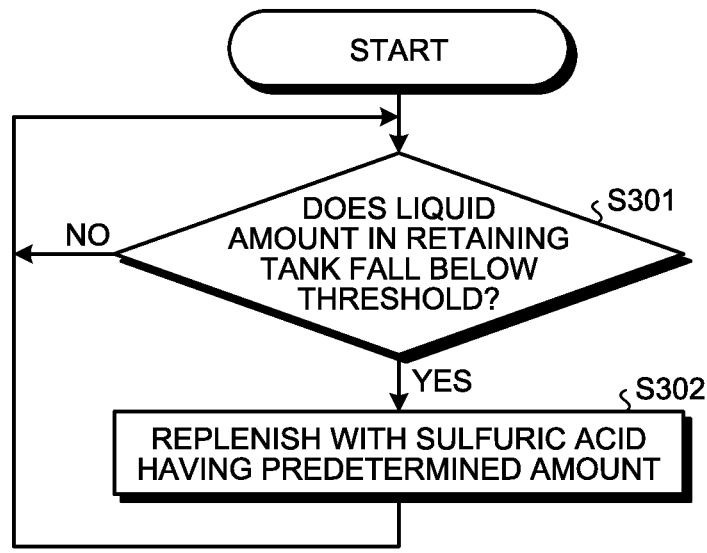
FIG. 11 is a flowchart illustrating one example of a procedure for a replenishing process.

Next, contents of a replenishing process of sulfuric acid will be explained with reference to FIG. 11. FIG. 11 is a flowchart illustrating one example of a procedure for the replenishing process. The processing procedure depicted in FIG. 11 is controlled by the controller 18.

As illustrated in FIG. 11, the controller 18 determines whether or not a liquid amount in the retaining tank 102 falls below a threshold (Step S301). For example, when the liquid level sensor S1 detects a lower limit of the liquid level in the retaining tank 102, the controller 18 determines that a liquid amount in the retaining tank 102 falls below the threshold. The controller 18 repeats the process of Step S301 until determining that a liquid amount in the retaining tank 102 falls below the threshold (Step S301: No).

Moreover, not limited thereto, the controller 18 may acquire, as liquid amount information on the liquid amount of in the retaining tank 102, for example, the weight of liquid in the retaining tank 102 and an elapsed time interval from the last replenishment, and perform the above-mentioned determination on the basis of this liquid amount information.

In Step S301, when determining that a liquid amount in the retaining tank 102 falls below the threshold (Step S301: Yes), the controller 18 replenishes the retaining tank 102 with a predetermined amount of sulfuric acid via the supply route 170 (Step S302), and returns the process to Step S301.

In Step S302, the controller 18 replenishes the retaining tank 102 with sulfuric acid having a concentration similar to an initial concentration of sulfuric acid retained in the retaining tank 102 and having an amount similar to a reduction amount of liquid in the retaining tank 102. Thus, the concentration and the liquid amount of the retaining tank 102 are kept constant.

9. Configuration Example of Retaining Tank

Figure 12:
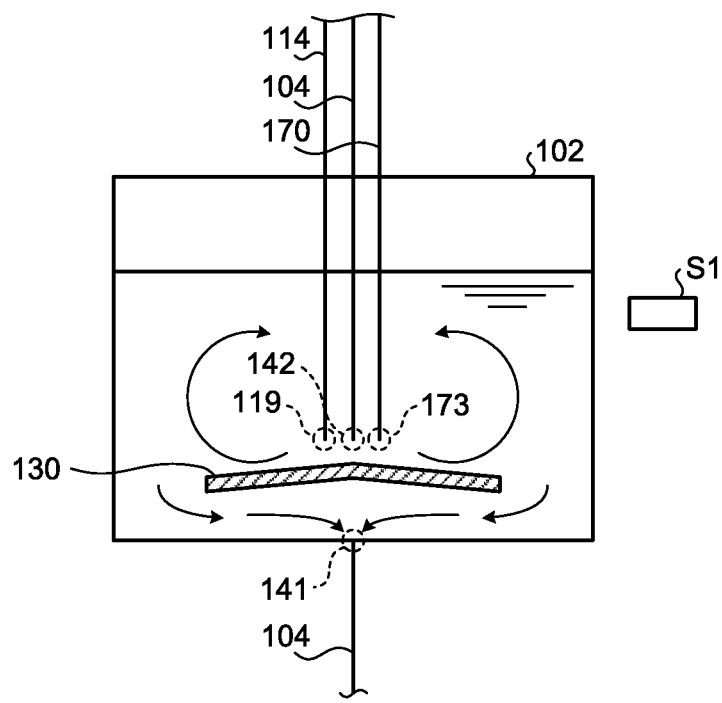
FIG. 12 is a diagram illustrating a configuration example of the retaining tank.

Next, a configuration example of the retaining tank 102 will be explained with reference to FIG. 12. FIG. 12 is a diagram illustrating a configuration example of the retaining tank 102.

As illustrated in FIG. 12, a segmenting member 130 is arranged inside the retaining tank 102, which segments the inside of the retaining tank 102 into an upper part and a lower part. The segmenting member 130 is arranged while interposing a predetermined gap between the segmenting member 130 and a side wall of the retaining tank 102.

The retaining tank 102 includes an output port 141 of the recovery route 114, which is for outputting sulfuric acid in the retaining tank 102. This output port 141 is arranged below the segmenting member 130. A return port 142 of the circulation route 104 is arranged above the segmenting member 130, which is for discharging sulfuric acid output from the output port 141 to the segmenting member 130.

The return port 142 of the circulation route 104 is arranged above the segmenting member 130, and thus convection of sulfuric acid is generated, above the segmenting member 130, by a flow of sulfuric acid that is discharged from the return port 142. Sulfuric acid in the retaining tank 102 is always stirred by this convection, and thus the concentration of sulfuric acid in the retaining tank 102 is able to be quickly stabilized even when already-used SPM is supplied to the retaining tank 102 from the recovery route 114.

The return port 142 of the circulation route 104 is arranged close to the segmenting member 130 so that a flow of sulfuric acid flowing from the return port 142 reaches the segmenting member 130 and convection of sulfuric acid is formed in the retaining tank 102. A specific arrangement of the return port 142 will be mentioned later.

The sulfuric acid stirred above the segmenting member 130 moves under the segmenting member 130 through the gap between the segmenting member 130 and the side wall of the retaining tank 102 so as to flow into the circulation route 104 from the output port 141 arranged below the segmenting member 130.

As described above, in the substrate processing system 1 according to the first embodiment, the output port 141 of the circulation route 104 is arranged below the segmenting member 130, and thus it is possible to prevent already-used SPM supplied out of the recovery route 114 from directly flowing into the output port 141.

Figure 13:
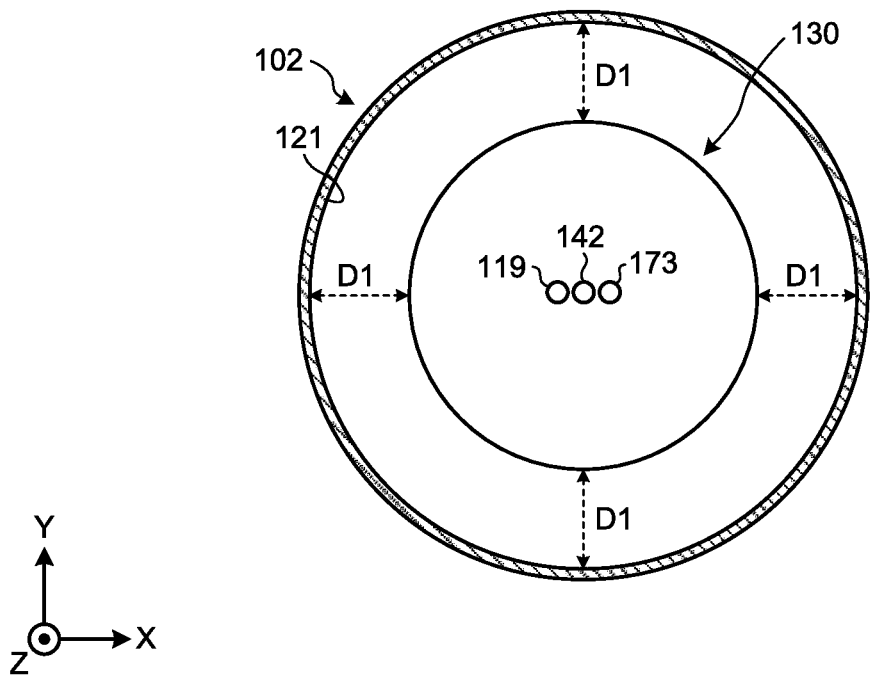
FIG. 13 is a schematic plan cross-sectional view illustrating the retaining tank.
Figure 14:
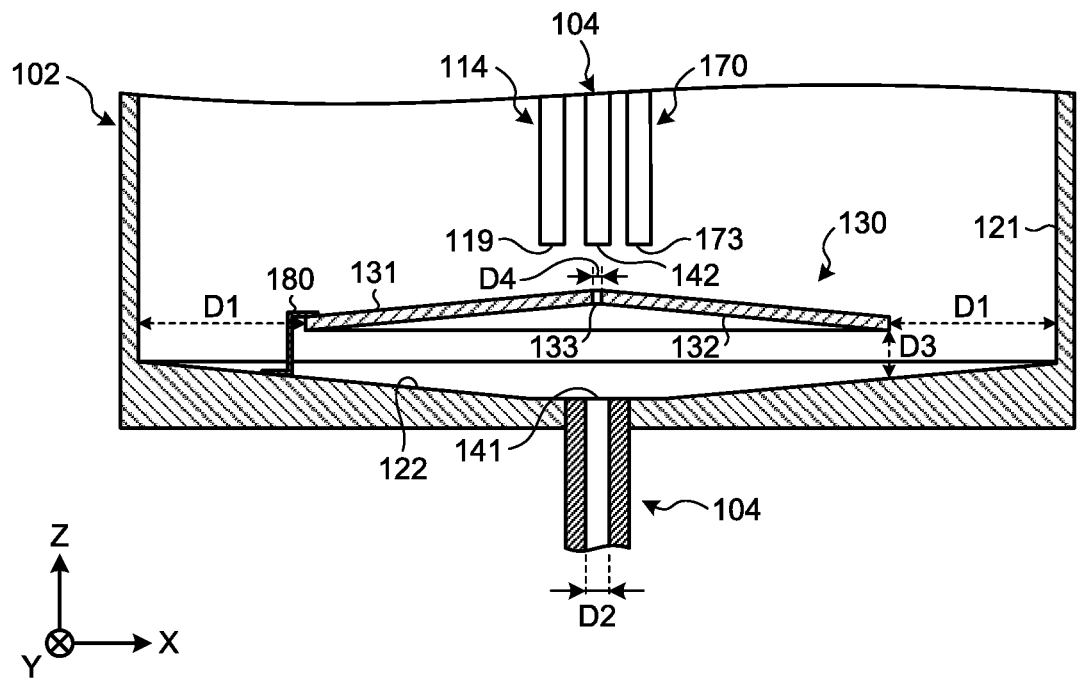
FIG. 14 is a schematic side cross-sectional view illustrating the retaining tank.

Next, an inner configuration of the retaining tank 102 will be explained with reference to FIGS. 13 and 14. FIG. 13 is a schematic plan cross-sectional view illustrating the retaining tank 102. FIG. 14 is a schematic side cross-sectional view illustrating the retaining tank 102. In FIG. 13, a fixing member 180 illustrated in FIG. 14 is omitted.

As illustrated in FIG. 13, the retaining tank 102 is formed in a cylindrical shape. By employing the cylindrical-shaped retaining tank 102, stagnation of sulfuric acid is hard to be generated in the retaining tank 102 compared with an angular-shaped tank, so that it is possible to more efficiently stir sulfuric acid. Therefore, it is possible to further shorten the time interval until the concentration of sulfuric acid in the retaining tank 102 has been stabilized.

It is preferable that the retaining tank 102 is formed in a perfect circle shape in plan view so that stagnation is hard to be generated in the retaining tank 102; however, the retaining tank 102 may be formed in an ellipse shape in plan view.

Moreover, as illustrated in FIG. 13, the return port 142 of the circulation route 104 is arranged in a central portion of the retaining tank 102 in plan view. As described above, the return port 142 of the circulation route 104, which is an origin of the convection, is arranged in the central portion of the retaining tank 102 in plan view, and thus bias of the convection of sulfuric acid is hard to be generated, so that it is possible to improve a stirring property of sulfuric acid.

As illustrated in FIG. 13, a supply port 119 of the recovery route 114 and a supply port 173 of the supply route 170 are arranged near the return port 142 of the circulation route 104 in plan view. As described above, the supply port 119 of the recovery route 114 and the supply port 173 of the supply route 170 are arranged in the central portion of the retaining tank 102 that is an origin of the convection, it is easy for already-used SPM supplied from the recovery route 114 and sulfuric acid supplied from the supply route 170 to go with the convection. Therefore, it is possible to more shorten the time interval until the concentration of sulfuric acid in the retaining tank 102 has been stabilized. It is further possible to prevent inhibition of the convection that is caused by flows of already-used SPM supplied from the recovery route 114 and sulfuric acid supplied from the supply route 170.

When the recovery route 114 and the supply route 170 are compared with the circulation route 104, contribution degree to the convection formation of the circulation route 104 that continuously supplies sulfuric acid to the retaining tank 102 is larger than that of the recovery route 114 and the supply route 170. Thus, it is preferable that the return port 142 of the circulation route 104 having a larger contribution degree to the convection formation is arranged at a position closer to the center of the retaining tank 102. In other words, it is preferable that the supply port 119 of the recovery route 114 and the supply port 173 of the supply route 170 that have smaller contribution degrees to the convection formation than the circulation route 104 are arranged at positions further from the center of the retaining tank 102 than the return port 142 of the circulation route 104.

As illustrated in FIG. 12, the return port 142 of the circulation route 104, the supply port 119 of the recovery route 114, and the supply port 173 of the supply route 170 are arranged lower than the liquid level sensor S1, in other words, lower than the lower limit of the liquid level in the retaining tank 102. Thus, the return port 142 of the circulation route 104, the supply port 119 of the recovery route 114, and the supply port 173 of the supply route 170 are arranged lower than the lower limit of the liquid level in the retaining tank 102, and thus they are always soaked in sulfuric acid in the retaining tank 102. Therefore, when sulfuric acid and/or already-used SPM are supplied to the retaining tank 102 from any of the return port 142, the supply port 119, and the supply port 173, bubbling of sulfuric acid is able to be prevented, which is caused by mixing of air bubbles with sulfuric acid in the retaining tank 102. Furthermore, inhibition of the convection in the retaining tank 102, which is caused by air bubbles, is able to be prevented.

The gap between a side wall 121 of the retaining tank 102 and the segmenting member 130 is formed along the entire periphery of the segmenting member 130. Thus, it is possible to prevent generation of stagnation of sulfuric acid between the side wall 121 of the retaining tank 102 and the segmenting member 130.

The gap is formed, between the side wall 121 of the retaining tank 102 and the segmenting member 130, which has a width that is even along the entire periphery of the segmenting member 130. Specifically, the segmenting member 130 is formed in a circle shape in plan view, which is similar to the retaining tank 102, and the segmenting member 130 is arranged at the center of the retaining tank 102, so that it is possible to make the gap between the side wall 121 of the retaining tank 102 and the segmenting member 130 even along the entire periphery of the segmenting member 130. As described above, the gap between the side wall 121 of the retaining tank 102 and the segmenting member 130 is formed to be even along the entire periphery of the segmenting member 130, so that it is possible to prevent generation of stagnation of sulfuric acid in the retaining tank 102. In other words, it is possible to stir sulfuric acid in the retaining tank 102 more evenly.

As illustrated in FIG. 14, an opening area D1 of the gap between the side wall 121 of the retaining tank 102 and the segmenting member 130 is equal to or more than an opening area D2 of the output port 141 of the circulation route 104. Furthermore, an opening area D3 of a gap between a bottom surface 122 of the retaining tank 102 and the segmenting member 130 is equal to or more than the opening area D2 of the output port 141 of the circulation route 104. Thus, it is possible to reduce increase in pressure loss caused by the segmenting member 130 as much as possible.

The segmenting member 130 is fixed in a state where the segmenting member 130 is separated from the bottom surface 122 of the retaining tank 102 by the fixing member 180. Therefore, the opening area D3 of a gap between the bottom surface 122 of the retaining tank 102 and the segmenting member 130 is able to be adjusted easily by changing the fixing member 180.

As illustrated in FIG. 14, the segmenting member 130 is formed in an umbrella shape. Specifically, an upper surface 131 of the segmenting member 130 has a shape whose height is more reduced as a position is closer to its periphery portion from its central portion. Thus, for example, it is possible to prevent sulfuric acid from remaining on the upper surface 131 of the segmenting member 130 when whole of sulfuric acid in the retaining tank 102 is ejected to the outside from the return port 142.

The bottom surface 122 of the retaining tank 102 has a gradient that is falling toward its central portion, and the output port 141 of the circulation route 104 is arranged at the central portion of the bottom surface 122. Therefore, it is possible to efficiently drain sulfuric acid in the retaining tank 102 into the output port 141.

The segmenting member 130 includes a through hole 133 at its central portion. This through hole 133 is for venting air, and is able to vent air pooled under a lower surface 132 of the segmenting member 130 when supplying sulfuric acid to the vacant retaining tank 102.

The through hole 133 is formed so that the diameter of the through hole 133 is smaller than that of the output port 141 of the circulation route 104. Specifically, an opening area D4 of the through hole 133 is formed so that the opening area D4 is smaller than the opening area D2 of the output port 141. Therefore, it is possible to prevent sulfuric acid supplied from the return port 142 of the circulation route 104 and the supply port 173 of the supply route 170, or already-used SPM supplied from the supply port 119 of the recovery route 114 from directly flowing into the output port 141 of the circulation route 104 through the through hole 133.

The lower surface 132 of the segmenting member 130 is formed in a shape whose height is more reduced as a position goes from its central portion to its periphery portion. Thus, it is possible to gather air pooled under the lower surface 132 of the segmenting member 130 to the central portion of the segmenting member 130 so as to effectively vent the air through the through hole 133.

10. Circulation Temperature Adjusting Process

By the way, in the substrate processing system 1, a circulation temperature adjusting process for controlling the heater 109 so as to adjust the temperature of sulfuric acid circulating through the circulation route 104 may be executed so as to keep the temperature of SPM constant.

Figure 15:
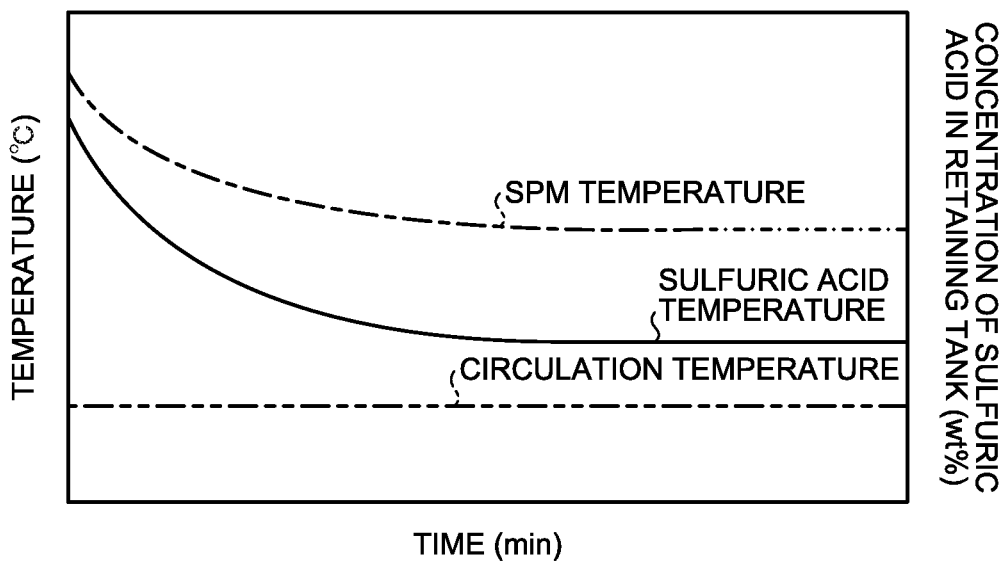
FIG. 15 is a graph depicting temporal changes in a temperature of SPM and a concentration of sulfuric acid in the retaining tank when a circulation temperature adjusting process is not executed.
Figure 16:
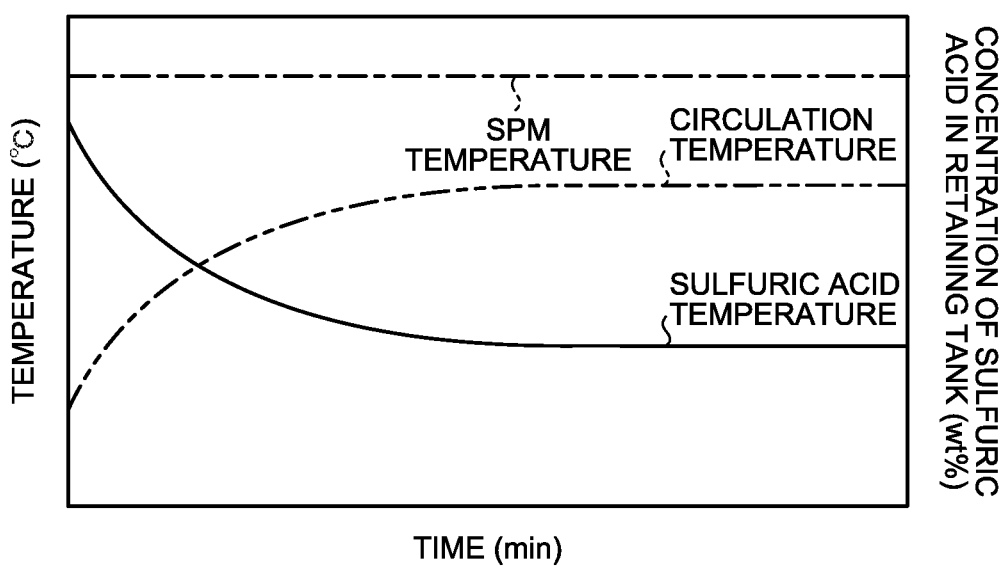
FIG. 16 is a graph depicting temporal changes in the temperature of SPM and the concentration of sulfuric acid in the retaining tank when the circulation temperature adjusting process is executed.

FIG. 15 is a graph depicting temporal changes in the temperature of SPM and the concentration of sulfuric acid in the retaining tank 102 when the circulation temperature adjusting process is not executed. FIG. 16 is a graph depicting temporal changes in the temperature of SPM and the concentration of sulfuric acid in the retaining tank 102 when the circulation temperature adjusting process is executed.

As illustrated in FIG. 15, when the heater 109 is controlled so that the temperature (circulation temperature) of sulfuric acid circulating through the circulation route 104 is constant, the temperature of SPM is reduced by an amount corresponding to reduction in reaction heat between sulfuric acid and hydrogen peroxide, which is due to reduction in the concentration of sulfuric acid in the retaining tank 102.

Therefore, as illustrated in FIG. 16, the controller 18 may control the heater 109 so that the temperature of SPM is constant. In other words, the controller 18 may control the heater 109 so that the circulation temperature is higher as the concentration of sulfuric acid in the retaining tank 102 is lower. Thus, it is possible to suppress performance reduction in the SPM process due to reduction in the concentration of sulfuric acid.

Specifically, the controller 18 uses the concentration of sulfuric acid that is detected by the concentration meter 110 as concentration information, and adjusts a heating temperature of sulfuric acid heated by the heater 109 in accordance with this concentration information.

The concentration information is not limited to the aforementioned example. For example, the controller 18 may store in the storage 19, as the concentration information, the number of the wafers W having been processed by using SPM. The heating temperature of sulfuric acid heated by the heater 109 may be adjusted by using this concentration information.

Furthermore, the controller 18 may use the specific gravity of liquid retained in the retaining tank 102 as the concentration information so as to adjust the heating temperature of sulfuric acid heated by the heater 109. In this case, it is sufficient that the substrate processing system 1 includes a gravimeter as a concentration information acquiring unit. The gravimeter may be provided on the circulation route 104, for example.

Furthermore, the controller 18 may use, as the concentration information, the water load of liquid in the retaining tank 102, for example. In this case, it is sufficient that the substrate processing system 1 includes, for example, a pressure meter as the concentration information acquiring unit. Furthermore, the controller 18 may use, as the concentration information, an electric power amount that is consumed by the heater 109. In this case, it is sufficient that the substrate processing system 1 includes, for example, an electric power meter as the concentration information acquiring unit.

As described above, the substrate processing system 1 according to the first embodiment (one example of substrate processing apparatus) includes the retaining tank 102, the processing unit 16 (one example of substrate processing unit), the recovery route 114, the discarding route 115, the supply route 170, the switching unit 80, and the controller 18 (one example of switching controller). The retaining tank 102 retains sulfuric acid (first processing liquid). The processing unit 16 processes the wafer W (one example of substrate) by using SPM of sulfuric acid supplied from the retaining tank 102 and hydrogen peroxide (one example of second processing liquid). The recovery route 114 returns, to the retaining tank 102, the SPM used by the processing unit 16. The discarding route 115 discards the used SPM to a place other than the retaining tank 102. The supply route 170 replenishes the retaining tank 102 with sulfuric acid having a concentration relatively higher than that of sulfuric acid retained in the retaining tank 102. The switching unit 80 switches a flowing destination of the already-used SPM between the recovery route 114 and the discarding route 115. The controller 18 controls the switching unit 80 on the basis of a predetermined recovery rate so as to cause the already-used SPM to flow into the discarding route 115 during a time interval until the first time interval has elapsed from a time point when the processing unit 16 starts a process using SPM, cause the already-used SPM to flow into the recovery route 114 during a time interval until the second time interval has elapsed after the first time interval elapses, and cause the already-used SPM to flow into the discarding route 115 during a time interval until the process using SPM has been ended from a time point when the second time interval elapses.

Therefore, by employing the substrate processing system 1 according to the first embodiment, it is possible to recover SPM with high accuracy so that sulfuric acid for processing the wafer W has a desired concentration.

The recovery rate is a recovery rate that keeps a concentration of sulfuric acid retained in the retaining tank 102 at the lower-limit concentration Cmin that is set to be a lower limit of the concentration of sulfuric acid needed for the process using SPM. Thus, it is possible to reduce consumption of sulfuric acid as quickly as possible.

The substrate processing system 1 according to the first embodiment includes the circulation route 104, the branch routes 112, and the segmenting member 130. The circulation route 104 outputs the sulfuric acid retained in the retaining tank 102 to return the output sulfuric acid to the retaining tank 102. Each of the branch routes 112 is connected to the circulation route 104 to supply, to the processing unit 16, the sulfuric acid flowing through the circulation route 104. The segmenting member 130 is arranged while interposing a gap between the segmenting member 130 and the side wall 121 of the retaining tank 102 so as to segment the inside of the retaining tank 102 into an upper part and a lower part. The output port 141 of the circulation route 104, which outputs sulfuric acid in the retaining tank 102, is arranged below the segmenting member 130, and a return port 142 of the circulation route 104, which discharges the sulfuric acid output from the output port 141 toward the segmenting member 130, is arranged above the segmenting member 130. Thus, the concentration of sulfuric acid in the retaining tank 102 is able to be quickly stabilized even when already-used SPM is supplied to the retaining tank 102 from the recovery route 114.

The substrate processing system 1 according to the first embodiment includes the heater 109 (one example of heating unit), the concentration meter 110 (one example of concentration information acquiring unit), and the controller 18 (one example of temperature controller). The heater 109 heats sulfuric acid to be supplied to the processing unit 16. The concentration meter 110 acquires concentration information of the sulfuric acid to be supplied to the processing unit 16. The controller 18 controls a heating temperature of sulfuric acid heated by the heater 109 in accordance with the concentration information acquired by the concentration meter 110.

The substrate processing system 1 according to the first embodiment includes the controller 18 (one example of replenishment controller). The controller 18 replenishes, through the supply route 170, the retaining tank 102 with sulfuric acid having a concentration that is a same as an initial concentration of sulfuric acid retained in the retaining tank 102 and an amount that is a same as a reduction amount of liquid in the retaining tank 102. Therefore, an increased amount is not to be discarded, and a shortage amount is not to be fed, and thus it is possible to reduce consumption of sulfuric acid as quickly as possible.

Second Embodiment

Figure 17:
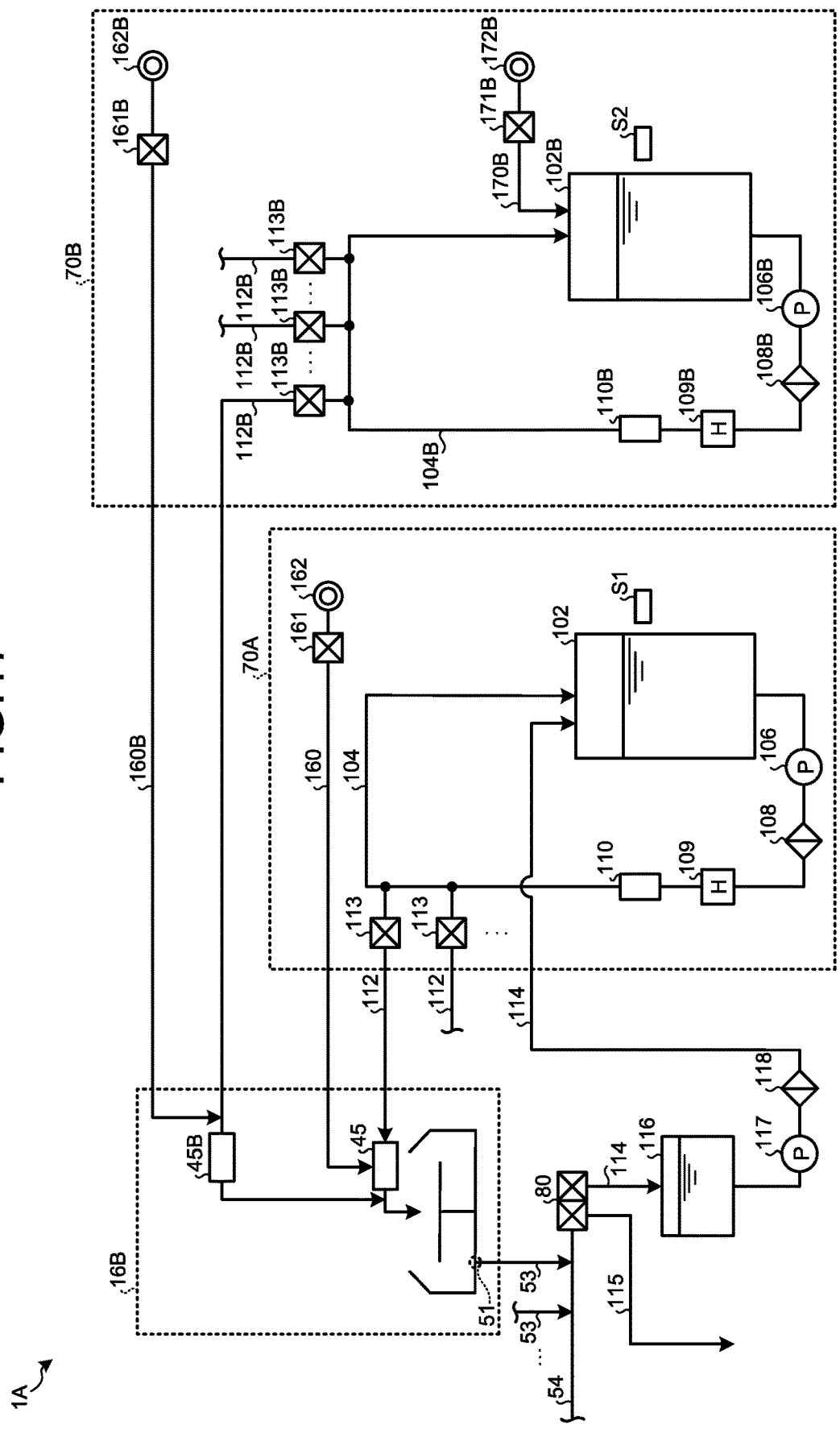
FIG. 17 is a diagram illustrating a configuration example a processing liquid supply system of a substrate processing system according to a second embodiment.

Next, a configuration of a processing liquid supply system of a substrate processing system according to a second embodiment will be explained with reference to FIG. 17. FIG. 17 is a diagram illustrating the configuration example of the processing liquid supply system of the substrate processing system according to the second embodiment. Note that in the following, a part different from the already-explained part will be mainly described, and the common parts are represented with same symbols and the description is omitted appropriately.

As illustrated in FIG. 17, a substrate processing system 1A according to the second embodiment includes a processing fluid supply source 70A, a processing fluid supply source 70B, and a processing unit 16B. A configuration of the processing fluid supply source 70A is similar to that of the processing fluid supply source 70 according to the first embodiment without the supply route 170, the valve 171, and the sulfuric acid supply source 172. In other words, sulfuric acid is not fed into the retaining tank 102 of the processing fluid supply source 70A, which is different from the processing fluid supply source 70 according to the first embodiment.

The processing fluid supply source 70B includes, as a supply system of sulfuric acid, a retaining tank 102B, a circulation route 104B, and a branch routes 112B. These are respectively similar to the retaining tank 102, the circulation route 104, and the branch routes 112, which are included in the processing fluid supply source 70 according to the first embodiment.

The retaining tank 102B is provided with a liquid level sensor S2 that is similar to the liquid level sensor S1. A pump 106B, a filter 108B, a heater 109B, and a concentration meter 110B are arranged on the circulation route 104B in this order from the upstream side of the circulation route 104B. The pump 106B, the filter 108B, the heater 109B, and the concentration meter 110B are respectively similar to the pump 106, the filter 108, the heater 109, and the concentration meter 110 according to the first embodiment.

The branch routes 112B are connected to respective mixing units 45B of the processing units 16B so as to supply sulfuric acid flowing through the circulation route 104B to the mixing units 45B. A valve 113B is provided with each of the branch routes 112B.

The processing fluid supply source 70B includes, as a supply system of hydrogen peroxide, a hydrogen peroxide supply route 160B, a valve 161B, and a hydrogen peroxide supply source 162B. One end of the hydrogen peroxide supply route 160B is connected with the hydrogen peroxide supply source 162B via the valve 161B, and the other end is connected with the mixing unit 45B of the corresponding processing unit 16B.

The processing fluid supply source 70B includes a supply route 170B, a valve 171B, and a sulfuric acid supply source 172B. One end of the supply route 170B is connected with the sulfuric acid supply source 172B via the valve 171B, and the other end is connected with the retaining tank 102B. The sulfuric acid supply source 172B supplies sulfuric acid having a concentration higher than that of sulfuric acid retained in the retaining tank 102B.

The processing unit 16B includes the mixing unit 45B. The mixing units 45B mixes highly-concentrated sulfuric acid supplied from the corresponding branch route 112B and hydrogen peroxide supplied from the hydrogen peroxide supply route 160B, so as to generate SPM that is mixed solution thereof, and supplies the generated SPM to a flow path on the upstream side from the mixing unit 45. The mixing unit 45B may be integrally configured with the processing fluid supply unit 40.

As described above, in the substrate processing system 1A according to the second embodiment, the SPM generated by using the highly-concentrated sulfuric acid that is supplied from the supply route 170B, in addition to the SPM generated by using sulfuric acid having reduced concentration that is supplied from the circulation route 104, is discharged to the wafer W.

As described above, when the concentration of sulfuric acid flowing through the circulation route 104 decreases, reaction heat generated by reaction between the sulfuric acid hydrogen peroxide accordingly decreases. On the contrary, the substrate processing system 1A according to the second embodiment is able to compensate the reduction in the reaction heat by using the reaction heat of SPM generated by the highly-concentrated sulfuric acid. Therefore, by employing the substrate processing system 1A according to the second embodiment, it is possible to suppress performance reduction in the SPM process due to reduction in the concentration of sulfuric acid.

Third Embodiment

Figure 18:
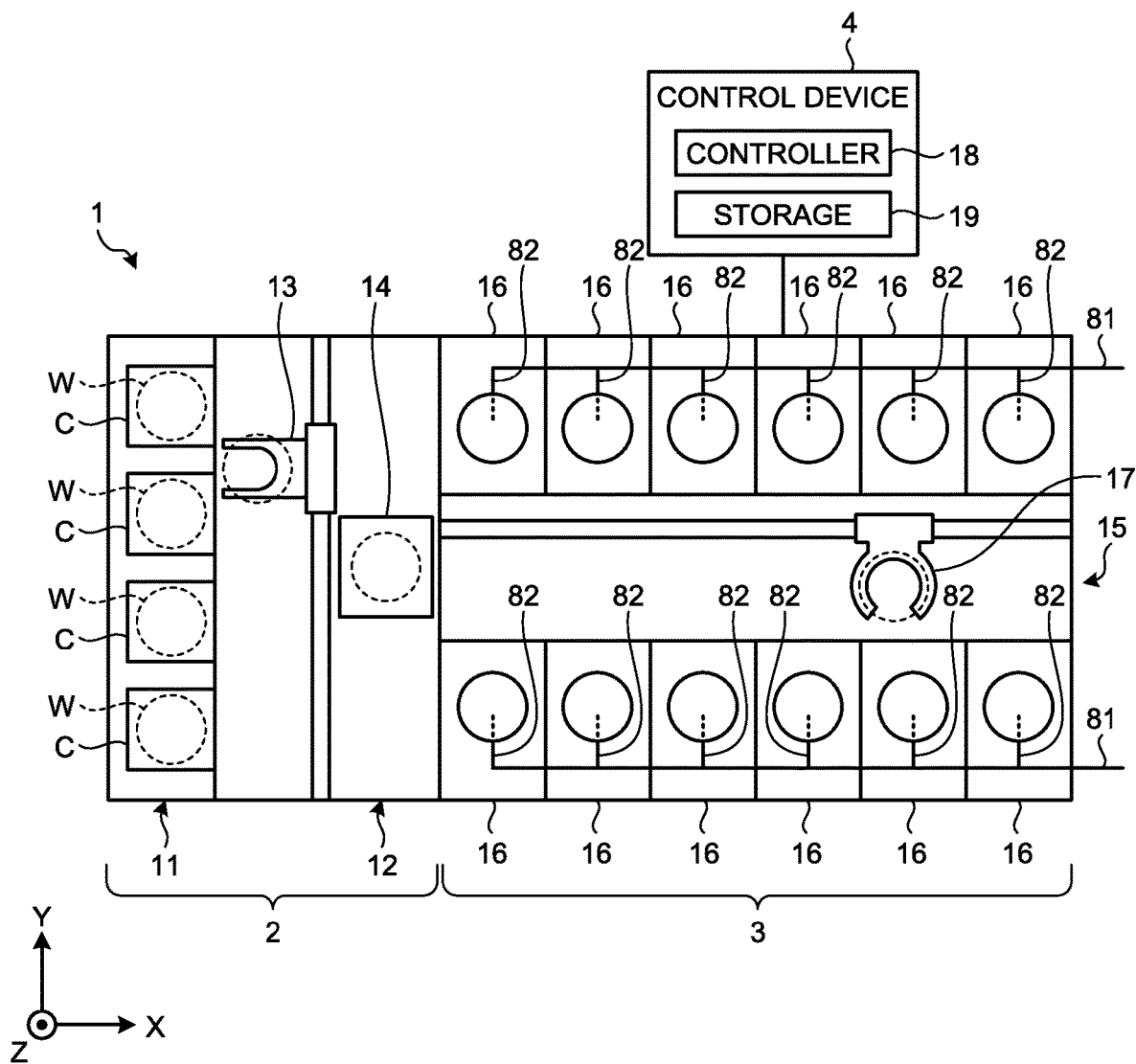
FIG. 18 is a diagram illustrating a schematic configuration of the substrate processing system according to a third embodiment.

Next, a configuration of a substrate processing system according to a third embodiment will be explained with reference to FIGS. 18 and 19. FIG. 18 is a diagram illustrating a schematic configuration of the substrate processing system 1 according to the third embodiment. Note that configurations similar to those illustrated in FIG. 3 are represented with the same reference symbols.

Each of newly-added common exhaust routes 81 collects and exhausts atmosphere including mixed chemical liquids that are used in the processing units 16. Lower exhaust routes 82 are provided so as to correspond to the respective processing units 16, and a leading end of each of the lower exhaust routes 82 is arranged under the chamber 20 of the corresponding processing unit 16 and the other end is connected with the corresponding common exhaust route 81.

Figure 19:
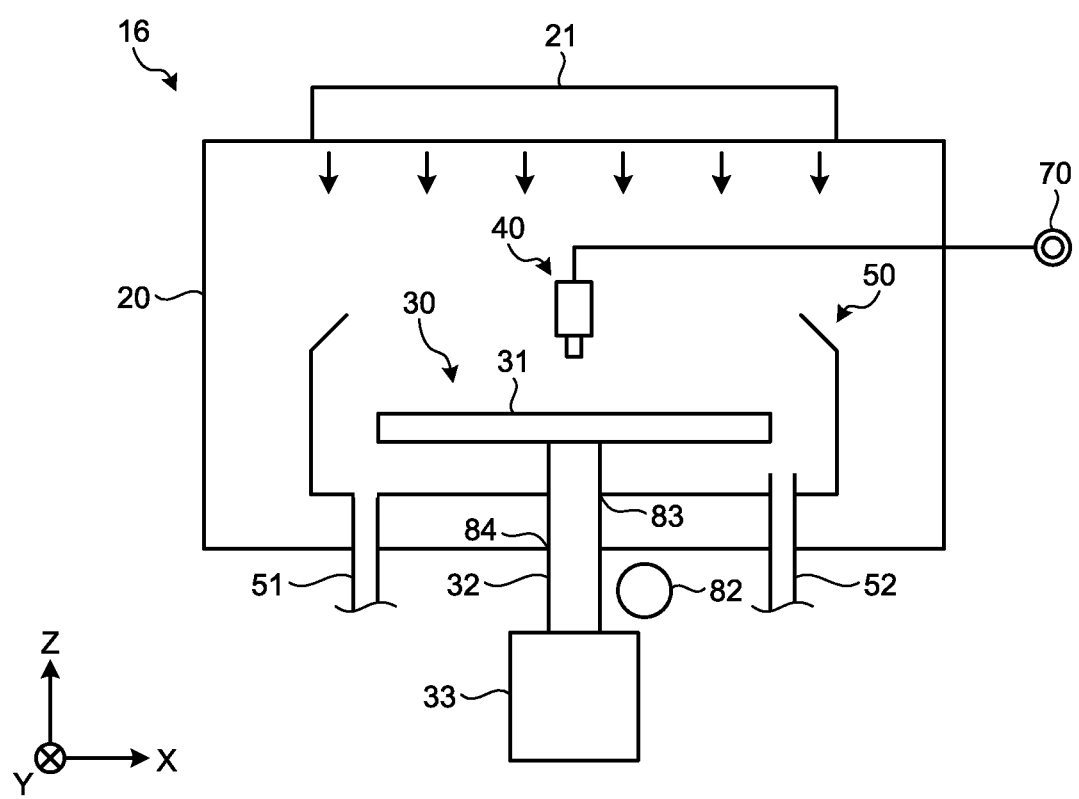
FIG. 19 is a diagram illustrating a schematic configuration of a processing unit according to the third embodiment.

FIG. 19 is a diagram illustrating a schematic configuration of the processing unit 16 according to the third embodiment. Note that configurations similar to those illustrated in FIG. 4 are represented with the same reference symbols. The lower exhaust route 82 is arranged under the chamber 20, and the leading end thereof is adjacent to the supporting unit 32.

A part of SPM supplied from the processing fluid supply unit 40 stirs up as mist above the wafer W to be mixed with atmosphere. The atmosphere including the SPM is led to a lower portion of the recovery cup 50 by the downflow of the FFU 21 ejected from the exhaust port 52.

In the recovery cup 50, there presents a minute gap 83 between the recovery cup 50 and the supporting unit 32 in order to rotate the supporting unit 32. There exists a case where the atmosphere mixed with the SPM leaks out through the gap 83 to an under portion of the recovery cup 50 from the inside of the recovery cup 50, in some cases. Similarly, there exists a case where the atmosphere mixed with the SPM leaks out through a minute gap 84 between the chamber 20 and the supporting unit 32 to an under portion of the chamber 20 from the inside of the chamber 20.

It is possible to suppress the passage of the atmosphere by providing, for example, a labyrinth structure, etc. However, leakage of the substrate processing system to the outside is to be prevented as much as possible.

Therefore, in the present embodiment, each of the lower exhaust routes 82 is eventually configured to suction the atmosphere having leaked out from the chamber 20 through the gap 84. By employing such a configuration, it is possible to prevent the atmosphere mixed with the SPM from leaking out to the outside of the substrate processing system.

In the present embodiment, the atmosphere that is mixed with the SPM is exemplified; however, not limited thereto, the aforementioned is able to be applied to a case where atmosphere including a chemical such as hydrocyanic acid gas and hydrogen sulfide gas is generated inside a chamber in a substrate processing system for performing a cleaning process on the group III-V wafer W.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

REFERENCE SIGNS LIST

W Wafer
1 Substrate processing system
16 Processing unit
18 Controller
80 Switching unit
102 Retaining tank
114 Recovery route
115 Discarding route
170 Supply route

The invention claimed is:

1. A substrate processing apparatus comprising:
a retaining tank that retains first processing liquid;
a substrate processing unit that comprises a chamber, the chamber comprising:
a substrate holder;
a processing fluid supply line that supplies mixed solution of the first processing liquid supplied from the retaining tank and second processing liquid to a substrate held by the substrate holder; and
a recovery cup that is arranged to collect the mixed solution supplied to the substrate;
a recovery route that returns, to the retaining tank, the mixed solution supplied to the substrate processing unit;
a discarding route that discards the supplied mixed solution to a place other than the retaining tank;
a supply route that supplies, to the retaining tank, the first processing liquid;
and
a switching controller configured to:
cause the supplied mixed solution to flow into the discarding route during a time interval until a first time interval has elapsed from a time point when the substrate processing unit starts to supply the mixed solution to the substrate;
cause the supplied mixed solution to flow into the recovery route during a time interval until a second time interval has elapsed after the first time interval elapses, the second time interval being decided based on a predetermined recovery rate; and
cause the supplied mixed solution to flow into the discarding route during a time interval until supply of the mixed solution has been ended from a time point when the second time interval elapses.

2. The substrate processing apparatus according to claim 1, further comprising:
a circulation route that outputs the first processing liquid retained in the retaining tank to return the output first processing liquid to the retaining tank;
a branch route that is connected to the circulation route to supply, to the substrate processing unit, the first processing liquid flowing through the circulation route; and
a segmenting member that is arranged while interposing a gap between the segmenting member and a side wall of the retaining tank so as to segment an inside of the retaining tank into an upper part and a lower part, wherein
an output port of the circulation route, which outputs the first processing liquid in the retaining tank, is arranged under the segmenting member, and a return port of the circulation route, which discharges the first processing liquid output from the output port toward the segmenting member, is arranged above the segmenting member.

3. The substrate processing apparatus according to claim 1, further comprising:
a heater that heats the first processing liquid to be supplied to the substrate processing unit;
a concentration meter that acquires concentration information of the first processing liquid to be supplied to the substrate processing unit; and
a temperature controller that controls a heating temperature of the first processing liquid heated by the heater in accordance with the concentration information acquired by the concentration meter.

4. The substrate processing apparatus according to claim 3, wherein
the concentration meter acquires, as the concentration information, a number of substrates that are processed by using the mixed solution.

5. The substrate processing apparatus according to claim 3, wherein
the concentration meter acquires, as the concentration information, a specific gravity of liquid retained in the retaining tank.

6. The substrate processing apparatus according to claim 1, wherein
- the supply route replenishes the retaining tank with the first processing liquid that has a concentration equal to or more than that of the first processing liquid having been recovered and retained in the retaining tank, and
- the recovery rate is a recovery rate that keeps a concentration of the first processing liquid retained in the retaining tank at a lower-limit concentration that is set to be a lower limit of a concentration of the first processing liquid needed for a process using the mixed solution.

7. The substrate processing apparatus according to claim 6, further comprising:
- a replenishment controller that replenishes, through the supply route, the retaining tank with the first processing liquid having a concentration that is a same as an initial concentration of the first processing liquid retained in the retaining tank and an amount that is a same as a reduction amount of liquid in the retaining tank.

8. The substrate processing apparatus according to claim 1, wherein
- the first processing liquid includes sulfuric acid, and
- the second processing liquid includes hydrogen peroxide.

9. A substrate processing method of a substrate processing apparatus,
- the substrate processing apparatus comprising:
  - a retaining tank that retains first processing liquid;
  - a substrate processing unit that comprise a chamber, the chamber comprising:
    - a substrate holder;
    - a processing fluid supply line that supplies mixed solution of the first processing liquid supplied from the retaining tank and second processing liquid to a substrate held by the substrate holder; and
    - a recovery cup that is arranged to collect the mixed solution supplied to the substrate;
  - a recovery route that returns, to the retaining tank, the mixed solution supplied to the substrate processing unit;
  - a discarding route that discards the supplied mixed solution to a place other than the retaining tank;
  - a supply route that supplies, to the retaining tank, the first processing liquid; and
- the substrate processing method comprising:
  - supplying, to the substrate, the mixed solution by using the substrate processing unit; and
  - discarding through the discarding route, to the place other than the retaining tank, the mixed solution supplied in the supplying during a time interval until a first time interval has elapsed from a time point when supply of the mixed solution to the substrate is started in the supplying;
  - returning the supplied mixed solution to the retaining tank through the recovery route during a time interval until a second time interval has elapsed after the first time interval elapses, the second time interval being decided based on a predetermined recovery rate; and
  - discarding through the discarding route, to the place other than the retaining tank, the supplied mixed solution during a time interval until the supplying has been ended from a time point when the second time interval elapses.

10. The substrate processing method according to claim 9, wherein
- the supply route replenishes the retaining tank with the first processing liquid that has a concentration equal to or more than that of the first processing liquid having been recovered and retained in the retaining tank, and
- the recovery rate is a recovery rate that keeps a concentration of the first processing liquid retained in the retaining tank at a lower-limit concentration that is set to be a lower limit of a concentration of the first processing liquid needed for a process using the mixed solution.

11. The substrate processing method according to claim 10, further comprising:
- replenishing, through the supply route, the retaining tank with the first processing liquid having a concentration that is a same as an initial concentration of the first processing liquid retained in the retaining tank and an amount that is a same as a reduction amount of liquid in the retaining tank.

12. The substrate processing method according to claim 9, wherein
- the first processing liquid includes sulfuric acid, and
- the second processing liquid includes hydrogen peroxide.

* * * * *